(12) United States Patent
Hashimoto

(10) Patent No.: US 7,579,630 B2
(45) Date of Patent: Aug. 25, 2009

(54) SEMICONDUCTOR OPTICAL DEVICE

(75) Inventor: Jun-ichi Hashimoto, Yokohama (JP)

(73) Assignee: Sumitomo Electric Industries Ltd., Osaka (JP)

( * ) Notice: Subject to any disclaimer, the term of this patent is extended or adjusted under 35 U.S.C. 154(b) by 206 days.

(21) Appl. No.: 11/716,682

(22) Filed: Mar. 12, 2007

(65) Prior Publication Data
US 2007/0215904 A1 Sep. 20, 2007

(30) Foreign Application Priority Data
Mar. 16, 2006 (JP) .......................... P2006-073266

(51) Int. Cl.
*H01L 33/00* (2006.01)
(52) U.S. Cl. .................. 257/98; 257/85; 257/E33.032; 372/50.124; 372/43.01
(58) Field of Classification Search ................. 257/85, 257/98, 99, 100, E33.032, E33.049; 372/50.124, 372/43.01, 45.01
See application file for complete search history.

(56) References Cited
U.S. PATENT DOCUMENTS

| 5,586,135 A * | 12/1996 | Yoshida et al. ........... 372/45.01 |
| 5,661,318 A * | 8/1997 | Nashimoto ................ 257/279 |
| 5,710,439 A * | 1/1998 | Ohkubo ....................... 257/85 |
| 7,205,220 B2 * | 4/2007 | Nakamura et al. .......... 438/604 |
| 7,356,063 B2 * | 4/2008 | Katsuyama et al. ..... 372/50.124 |

FOREIGN PATENT DOCUMENTS

| JP | 6-37355 | 2/1994 |
| JP | 2001-24282 | 1/2001 |
| JP | 2005-217091 | 8/2005 |

* cited by examiner

*Primary Examiner*—Phuc T Dang
(74) *Attorney, Agent, or Firm*—Smith, Gambrell & Russell, LLP

(57) ABSTRACT

A semiconductor optical device includes a GaAs substrate of a first conductivity type; a III-V compound semiconductor layer provided on the GaAs substrate; an active layer provided on the III-V compound semiconductor layer; and a cladding layer of a second conductivity type provided on the active layer, wherein the band gap energy of the III-V compound semiconductor layer is larger than the band gap energy of the GaAs substrate, wherein the band gap energy of the active layer is smaller than the band gap energy of the GaAs substrate, and wherein the thickness of the III-V compound semiconductor layer is not more than 0.2 μm.

4 Claims, 7 Drawing Sheets

SEMICONDUCTOR OPTICAL DEVICE

BACKGROUND OF THE INVENTION

1. Field of the Invention

The present invention relates to a semiconductor optical device.

2. Related Background Art

Semiconductor lasers are known (see for example Laid-open Japanese Patent Application No. 2001-24282) wherein an n-GaAs buffer layer, an n-Al$_{0.3}$Ga$_{0.7}$As lower cladding layer, an active layer, a p-Al$_{0.3}$Ga$_{0.7}$As upper cladding layer and p-GaAs cap layer are successively formed on an n-GaAs substrate. The thickness of the n-Al$_{0.3}$Ga$_{0.7}$As lower cladding layer is 1500 nm.

SUMMARY OF THE INVENTION

With the aim of simplifying the structure of a semiconductor laser as described above, the present inventors investigated making the GaAs substrate function as lower cladding layer, instead of forming a thick lower cladding layer on the GaAs substrate (including the buffer layer). Accordingly, the present inventors directly grew an active layer on the GaAs substrate. However, the inventors found that, when an active layer is directly grown on the GaAs substrate, the light emission efficiency of the semiconductor laser is lowered. The mechanism whereby the light emission efficiency of the semiconductor laser is lowered is believed to be as follows.

When an active layer is directly grown on the GaAs substrate, crystal defects are produced in the active layer due to crystal defects present on the surface of the GaAs substrate. Also, since the band gap energy of GaAs is small, at about 1.42 eV (1 eV=1.6×10$^{-19}$ J), the carriers cannot be confined strongly in the active layer by the GaAs substrate.

The present invention was made in view of the above, its object being to provide a semiconductor optical device having a simple structure and a high light emission efficiency.

In order to solve the above problem, a semiconductor optical device according to the present invention comprises: a GaAs substrate of a first conductivity type; a III-V compound semiconductor layer provided on the GaAs substrate; an active layer provided on the III-V compound semiconductor layer; and a cladding layer of a second conductivity type provided on the active layer, the band gap energy of the III-V compound semiconductor layer being larger than the band gap energy of the GaAs substrate, the band gap energy of the active layer being smaller than the band gap energy of the GaAs substrate, and the thickness of the III-V compound semiconductor layer being not more than 0.2 μm.

DESCRIPTION OF THE PREFERRED EMBODIMENTS

Embodiments of the present invention are described in detail below with reference to the appended drawings. In the description of the drawings, elements which are the same or similar are given the same reference symbols, to avoid repetition of description.

First Embodiment

Figure 1:
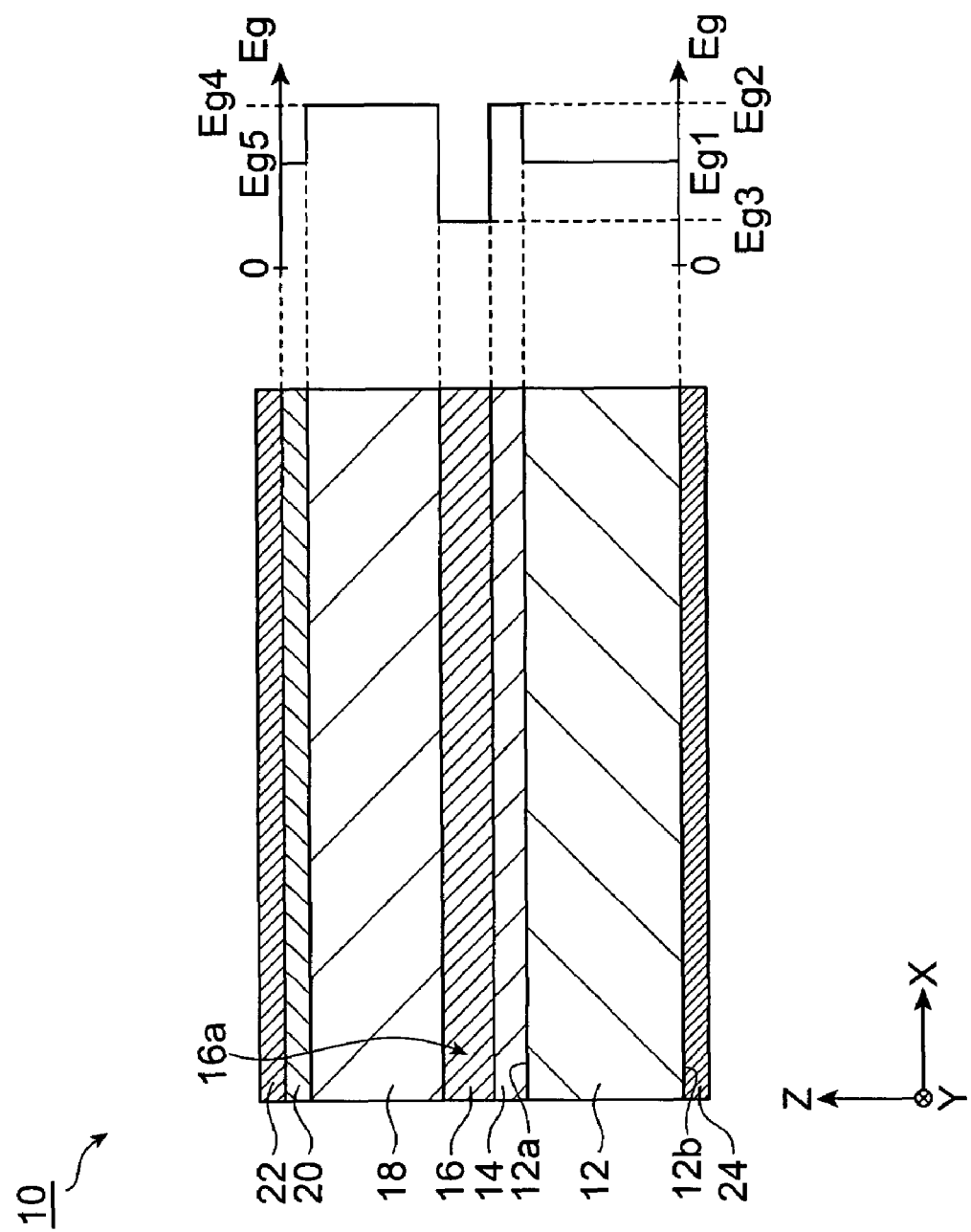
FIG. 1 is a cross-sectional view showing schematically a semiconductor optical device according to a first embodiment.

FIG. 1 is a cross-sectional view showing schematically a semiconductor optical device according to a first embodiment. In FIG. 1, a three-dimensional space is represented by an X axis, Y axis and Z axis. FIG. 1 also shows an energy band diagram of a semiconductor optical device according to the first embodiment. The axis Eg shows the magnitude of the band gap energy.

The semiconductor optical device 10 shown in FIG. 1 comprises: a GaAs substrate 12 of a first conductivity type (in this case assumed to be n type), a III-V compound semiconductor layer 14 provided on the surface 12a of the GaAs substrate 12, an active layer 16 provided on the III-V compound semiconductor layer 14, and an upper cladding layer 18 of a second conductivity type (in this case assumed to be p type) provided on the active layer 16. The surface 12a of the GaAs substrate 12 extends substantially parallel with the XY plane. The thickness direction of the GaAs substrate 12 is therefore the Z axis direction.

On the upper cladding layer 18 there are preferably provided in this order a contact layer 20 and electrodes 22. Thanks to the contact layer 20, ohmic contact of the electrode 22 can be achieved. Preferably an electrode 24 is provided on the face (back face) 12b on the opposite side to the front face 12a of the GaAs substrate 12. The semiconductor optical device 10 is a semiconductor laser of oscillation wavelength longer than 1 μm that is used for example for optical communication.

Preferably the GaAs substrate 12 comprises a bulk substrate obtained by slicing for example a GaAs ingot and a GaAs buffer layer grown on this bulk substrate. In this case, the upper surface of the GaAs buffer layer is the upper surface 12a of the GaAs substrate 12. Crystal defects caused by for example cracks or scratches formed for example during manufacture of the GaAs substrate are usually present on the surface 12a of the GaAs substrate 12. For example the crystal defect density on the surface 12a of a GaAs substrate 12 used for manufacture of an optical device is usually from 100 to 2000 (cm$^{-2}$). The band gap energy (Eg1) of the GaAs substrate 12 is about 1.42 eV (1 eV=1.6×10$^{-19}$ J).

As shown in the band gap energy diagram of FIG. 1, the band gap energy (Eg2) of the III-V compound semiconductor layer 14 is larger than the band gap energy (Eg1) of the GaAs substrate 12. The band gap energy (Eg3) of the active layer 16 is smaller than the band gap energy (Eg1) of the GaAs substrate 12. The band gap energy (Eg4) of the upper cladding layer 18 is larger than the band gap energy (Eg3) of the active layer 16. The band gap energy (Eg5) of the contact layer 20 is smaller than the band gap energy (Eg4) of the upper cladding layer 18.

Preferably the III-V compound semiconductor layer 14 comprises a semiconductor material lattice-matched to GaAs. Examples of such semiconductor materials are materials having a lattice constant that is for example the same as or close to the lattice constant of the GaAs. In this way, the crystal quality of the III-V compound semiconductor layer 14 that is epitaxially grown on the upper surface 12a of the GaAs substrate 12 can be improved.

Preferably the III-V compound semiconductor layer 14 comprises an Al-free material such as for example GaInP, or GaInAsP. In this case, no Al oxidation can occur at the interface between the III-V compound semiconductor layer 14 and the active layer 16. Increase in nonradiative recombination centers caused by oxidation of Al at this interface can thereby be suppressed. Also, since no Al oxidation occurs at the surface of the III-V compound semiconductor layer 14, an active layer 16 can be grown on this surface with good crystal quality. In this way, a semiconductor optical device 10 of excellent performance and reliability is obtained.

It should be noted that the III-V compound semiconductor layer 14 could be made of for example a III-V compound semiconductor containing Al, such as for example AlGaInP, or AlGaAs. Furthermore, the III-V compound semiconductor layer 14 may be a III-V compound semiconductor material containing N, Ga and As, like the material of the active layer 16, to be described.

The III-V compound semiconductor layer 14 is preferably undoped III-V compound semiconductor but the III-V compound semiconductor layer 14 may also be doped with impurities. If the III-V compound semiconductor layer 14 is doped with impurities, the III-V compound semiconductor layer 14 preferably becomes the first conductivity type layer by this doping.

AlGaInP lattice-matched to GaAs may have band gap energy up to a maximum of about 2.3 eV by adjusting the composition ratios. AlGaAs lattice-matched to GaAs may have band gap energy up to a maximum of about 2.16 eV by adjusting the composition ratios. GaInAsP lattice-matched to GaAs may have band gap energy up to a maximum of about 1.9 eV by adjusting the composition ratios. GaInP lattice-matched to GaAs may have band gap energy up to a maximum of about 1.9 eV.

The thickness of the III-V compound semiconductor layer 14 is not more than 0.2 μm (200 nm); preferably it is more than 5 nm but not more than 50 nm. If the thickness of the III-V compound semiconductor layer 14 exceeds 0.2 μm, the thickness of the III-V compound semiconductor layer 14 of higher band gap than the GaAs becomes excessive, so it becomes a barrier that cannot be neglected, with the result that carriers cannot easily be injected into the active layer 16 from the GaAs substrate 12. On the other hand, if the thickness of the III-V compound semiconductor layer 14 is less than 5 nm, its effect to prevent crystal defects present in the upper surface 12a of the GaAs substrate 12 from propagating and penetrating into the active layer 16 becomes insufficient, which would degrade the crystal quality of the active layer 16. Also, since the thickness of the III-V compound semiconductor layer 14 is not more than 0.2 μm, the waveguiding optical mode is not confined in the III-V compound semiconductor layer 14, and it leaks considerably into the GaAs substrate 12. Therefore, the III-V compound semiconductor layer 14 does not act as a cladding layer.

The active layer 16 may have any of a bulk structure, single quantum well structure (SQW), or multiple quantum well structure (MQW). For example if the active layer 16 has a multiple quantum well structure, the active layer 16 comprises barrier layers and well layers alternately stacked.

Preferably the active layer 16 includes a III-V compound semiconductor material including nitrogen. Preferably the III-V compound semiconductor material contains N, Ga and As. Specific examples that may be mentioned include GaInNAs, and GaNAs. As one practical example, the active layer 16 consists of GaAs barrier layer of thickness 8 nm and a $Ga_{0.69}In_{0.31}N_{0.01}As_{0.99}$ well layer of thickness 7 nm which are stacked alternately.

By adjusting the composition ratios of the III-V compound semiconductor material containing N, Ga and As, the lattice constant can be set to be the same as or close to the lattice constant of GaAs. Consequently, when this material is grown on the GaAs substrate, no defects such as misfit dislocations caused by mismatching of the lattices are produced, so an active layer 16 of excellent crystal properties can be obtained. The band gap energy of the III-V compound semiconductor material containing N, Ga and As normally corresponds to a photoluminescent wavelength of longer than 1 μm. When such a III-V compound semiconductor material is employed for the material of the active layer 16, an oscillation wavelength in the long wavelength region of more than 1 μm can easily be realized: this can therefore be utilized for the manufacture of for example optical communication light sources in from 1 to 1.6 μm wavelength region. Since GaAs is transparent with respect to light in from 1 to 1.6 μm wavelength region, the light is not absorbed by the GaAs substrate 12. The GaAs substrate can therefore be used as lower cladding.

Also, at least one of Sb and P may be added to the GaInNAs or GaNAs. Sb functions as a so-called surfactant that suppresses three-dimensional growth of GaInNAs or GaNAs. The crystal quality of the GaInNAs or GaNAs is thereby improved. P reduces local crystal distortion of the GaInNAs or GaNAs. The crystal quality of the GaInNAs or GaNAs is thereby improved. Also, P increases the content of N that can be introduced into the crystal when crystal growth is performed.

Examples of III-V compound semiconductor materials containing N, Ga and As to which at least one of Sb or P has been added include: GaNAsP, GaInNAsP, GaNAsSb, GaInNAsSb, GaNAsSbP or GaInNAsSbP. By adjusting the composition ratios of these, the lattice constant can be set to be the same as or close to the lattice constant of GaAs. Consequently, when this material is grown on the GaAs substrate, no defects such as misfit dislocations caused by mismatching of the lattices are produced, so an active layer 16 of excellent crystal properties can be obtained.

Preferably the upper cladding layer 18 is a III-V compound semiconductor of the second conductivity type (P type). The upper cladding layer 18 is for example made of p-GaAs, but other semiconductor materials could be employed. In particular, preferably a material of band gap energy that is larger than the band gap energy of GaAs is employed for the upper cladding layer 18. If this is done, the difference of the band gap energies between the active layer 16 and the upper cladding layer 18 can be made larger than that of the case of the upper cladding layer 18 being made of GaAs. Consequently, more carriers can be confined in the active layer 16 compared with the case of the upper cladding layer 18 being made of GaAs.

Also, since the band gap energy (Eg4) of the upper cladding layer 18 is larger than the band gap energy of GaAs, the refractive index of the upper cladding layer 18 is significantly lower than the refractive index of the GaAs. Consequently, since the refractive index difference of the active layer 16 and the upper cladding layer 18 becomes larger, more light can be confined in the active layer 16 compared with the case where GaAs is employed for the upper cladding layer 18. Consequently, the light emission efficiency of the semiconductor optical device 10 is further increased. As such a material of higher band gap than GaAs, for example material such as AlGaInP, GaInP, AlGaAs, or GaInAsP lattice-matched to GaAs i.e. the same materials as are employed for the III-V compound semiconductor layer 14 may be employed for the upper cladding layer 18.

In order to facilitate ohmic contact formation with the electrode 22, the contact layer 20 has a significantly smaller band gap than the upper cladding layer 18, and is preferably made of III-V compound semiconductor of second conductivity type. The contact layer 20 may be made of for example p+-GaAs.

When growing the III-V compound semiconductor layer 14, active layer 16, upper cladding layer 18 and contact layer 20, for example a vapor phase growth method such as an OMVPE method or MBE method may be employed.

In the semiconductor optical device 10 as described above, when the electrode 22 is the high potential side and voltage is applied between the electrode 22 and the electrode 24, one type of carriers (in this case let us say holes) is injected into the active layer 16 from the upper cladding layer 18. Concurrently, since the thickness of the III-V compound semiconductor layer 14 is not more than 0.2 μm, the other type of carriers (in this case let us say electrons) will be injected into the active layer 16 from the GaAs substrate 12, passing through the III-V compound semiconductor layer 14. Light is emitted from the active layer 16 by recombination of the electrons and holes in the active layer 16.

Since the band gap energy (Eg1) of the GaAs substrate 12 is larger than the band gap energy (Eg3) of the active layer 16, the GaAs substrate 12 functions as a lower cladding layer (member that confines the carriers and light in the active layer 16). Consequently, it is unnecessary to provide a further lower cladding layer between the GaAs substrate 12 and the active layer 16. As a result, the structure of the semiconductor optical device 10 can be simplified.

Also, thanks to the provision of the III-V compound semiconductor layer 14, crystal defects present at the surface 12a of the GaAs substrate 12 can be restrained from propagating and reaching the active layer 16. The crystal quality of the active layer 16 can thereby be improved. Furthermore, since the band gap energy Eg2 of the III-V compound semiconductor layer 14 is larger than the band gap energy Eg1 of the GaAs substrate 12, leakage of carriers from the active layer 16 into the GaAs substrate 12 can be satisfactorily suppressed. As a result, more carriers can be confined in the active layer 16. Consequently, a semiconductor optical device 10 of high light emission efficiency is obtained. Likewise also, since leakage of carriers from the active layer 16 into the GaAs substrate 12 is suppressed, nonradiative recombination of holes and electrons due to crystal defects present at the surface 12a of the GaAs substrate 12 is very considerably reduced. Consequently, since the reduction of internal quantum efficiency can be well suppressed, the light emission efficiency is enormously improved.

In this case, since the growth of the lower cladding layer, which normally needs to have a thickness of more than 2 μm for good optical confinement, is not needed, the process can be simplified, making it possible to improve productivity and lower costs. Also, due to the unnecessity of the growth of the lower cladding layer, the operation time of the crystal growth equipment can be saved significantly, leading to less degradation of the crystal growth equipment. It should be noted that, in this structure, it is necessary to grow a new III-V compound semiconductor layer 14. However, since this is a thin film of not more than 0.2 μm, the additional time to grow this layer can be neglected and has no effect on productivity or costs.

Figure 2:
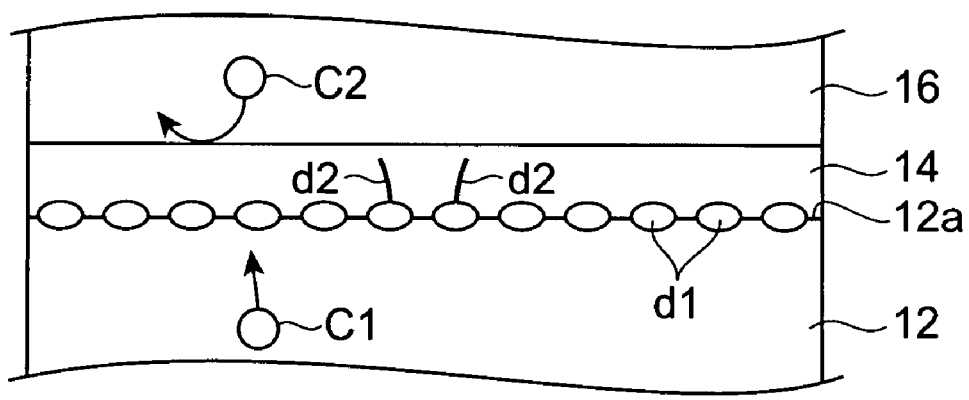
FIG. 2 is a view showing schematically part of the semiconductor optical device shown in FIG. 1.

FIG. 2 is a view showing schematically a part of the semiconductor optical device shown in FIG. 1. As shown in FIG. 2, when crystal defects d1 present at the surface 12a of the GaAs substrate 12 are propagated, crystal defects d2 are formed in the III-V compound semiconductor layer 14. However, by providing the III-V compound semiconductor layer 14, these crystal defects d2 are terminated within the III-V compound semiconductor layer 14. If the III-V compound semiconductor layer 14 is a high crystalline quality layer, the crystal defects d2 are easily terminated in the III-V compound semiconductor layer 14. It is therefore difficult for these crystal defects d2 to reach the active layer 16, so the crystal quality of the active layer 16 can be improved.

Furthermore, the band gap energy (Eg2) of the III-V compound semiconductor layer 14 is larger than the band gap energy (Eg1) of the GaAs substrate 12, so that the band gap energy difference between the III-V compound semiconductor layer 14 and the active layer 16 becomes very large. Consequently, leakage of carriers C2 from the active layer 16 through the III-V compound semiconductor layer 14 into the GaAs substrate 12 can be suppressed. As a result, more carriers can be confined in the active layer 16 than in the case where the active layer 16 contacts directly with the GaAs substrate 12. A semiconductor optical device 10 of high light emission efficiency and excellent reliability is therefore obtained.

Also, carriers (for example electrons) C1 advance towards the surface 12a of the GaAs substrate 12. However, the carriers (for example holes) C2 advancing towards the III-V compound semiconductor layer 14 from the active layer 16 are blocked by the hetero barrier at the interface between the active layer 16 and the III-V compound semiconductor layer 14. It is therefore difficult for the carriers C2 to reach the surface 12a of the GaAs substrate 12, so nonradiative recombination of holes and electrons at the crystal defects d1 present at the surface 12a of the GaAs substrate 12 is greatly reduced. Therefore, the decrease in the internal quantum efficiency can be prevented, so the light-emitting efficiency is very considerably improved.

Also, the band gap energy (Eg2) of the III-V compound semiconductor layer 14 is larger than the band gap energy (Eg1) of the GaAs substrate 12, so the refractive index of the III-V compound semiconductor layer 14 become significantly lower than the refractive index of the GaAs substrate 12. Consequently, the refractive index difference between the active layer 16 and the region outside this layer can be enlarged compared with the case where the active layer 16 contacts directly with the GaAs substrate 12, so that more light can be confined in the active layer 16. Consequently, the light emission efficiency of the semiconductor optical device 10 is increased.

Since, as described above, with the semiconductor optical device 10 the ability to confine carriers and light can be improved, the light emission performance and performance with temperature and other properties of the semiconductor optical device 10 can be improved.

Also, if the III-V compound semiconductor layer 14 is made of an undoped III-V compound semiconductor, the optical absorption by free carriers in the III-V compound semiconductor layer 14 is suppressed, so that waveguiding optical losses become small. The light emission efficiency of the semiconductor optical device 10 can thereby be further improved.

A further III-V compound semiconductor layer may be provided between the active layer 16 and the upper cladding layer 18. This further III-V compound semiconductor layer preferably consists of the same structure and material as the III-V compound semiconductor layer 14. This further III-V compound semiconductor layer may be an undoped III-V compound semiconductor or may be of second conduction type. If the band gap energy of this further III-V compound semiconductor layer is larger than the band gap energy of GaAs, more carriers can be confined in the active layer 16 compared with the case where an active layer 16 contacts directly with the upper cladding 18 made of GaAs. Also, in this case, the refractive index of this further III-V compound semiconductor layer is significantly lower than the refractive index of GaAs. Consequently, more light can be confined in the active layer 16 compared with the case where an active layer 16 contacts directly with the upper cladding 18 made of GaAs, since the refractive index difference between the active layer 16 and the region outside it can be enlarged.

A spot size conversion region may be provided at the light emission end 16a of the semiconductor optical device 10, in order to convert the spot size of the emitted light. In this way, the spot size of the light can be expanded. The spot size conversion region may be formed for example by making the thickness of the active layer 16 smaller or larger, or by making the width of the active layer 16 smaller or larger as the position in the X direction approaches to the light emission end 16a.

In the case of an ordinary semiconductor light-emitting device that is not provided with a spot size conversion region, the spot size of the light has a diameter of about from 1 to 2 μm. This is extremely small compared with the spot size (diameter from 8 to 10 μm) of for example a glass optical component, such as an optical fiber, so it is difficult to achieve optical coupling of these two with high coupling efficiency. However, in the case of a light-emitting end 16a provided with a spot size conversion region of the active layer 16, the spot size of the light can be expanded to a diameter of about from 8 to 10 μm. Therefore in a semiconductor optical device 10 provided with a spot size conversion region, it is possible to improve the optical coupling efficiency when the light-emitting end 16a of the semiconductor optical device 10 is optically coupled with an optical fiber.

Due to the increase of the spot size diameter to for example from 8 to 10 μm in the spot size conversion region, the light spreads widely from the active layer 16 to the cladding layer side. In this case, in order to prevent increased waveguide losses due to increased leakage of light to outside the cladding layer, it is necessary to make the upper and lower cladding layers thicker to an extent such as to sufficiently contain this leakage: for example, if the spot size is from 8 to 10 μm, the cladding layers must be made thicker to the extent of half of this i.e. about from 4 to 5 μm. However, in the actual crystal growth equipment, an enormous time is required to grow cladding layers of such thickness, resulting in deterioration of productivity and accelerated degradation of the crystal growth equipment due to overuse of it. On the other hand, in the semiconductor optical device 10, the GaAs substrate 12 can also function as the thick lower cladding layer, so the growth of the lower cladding layer becomes unnecessary. Consequently, compared with the prior art fabrication, the deterioration of productivity and degradation of the crystal growth equipment are significantly suppressed.

It should be noted that, in a semiconductor optical device using an InP substrate instead of the GaAs substrate, it is difficult to form a III-V compound semiconductor layer 14 having band gap energy that is larger than the band gap energy of the InP substrate on the InP substrate. The reason for this is that no materials exist which are lattice-matched to the InP substrate and have a higher band gap than InP.

Figure 3:
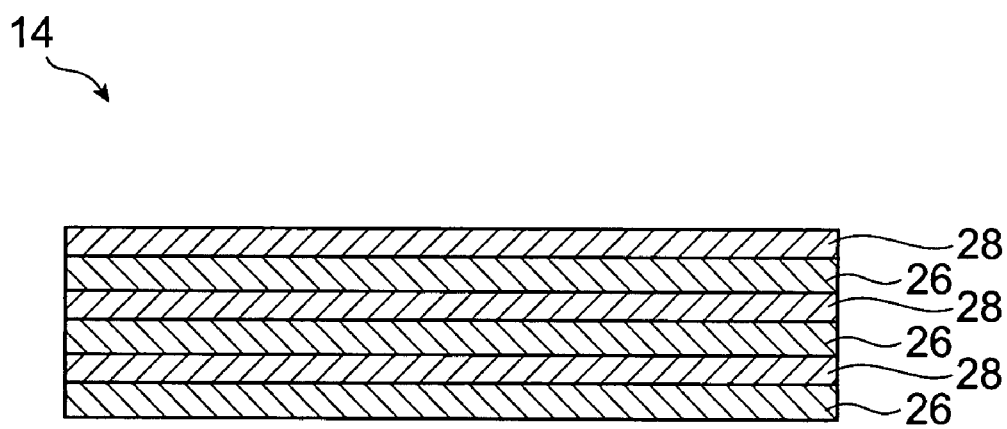
FIG. 3 is a cross-sectional view showing an example of the structure of a III-V compound semiconductor layer.

FIG. 3 is a cross-sectional view showing an example of the structure of a III-V compound semiconductor layer 14. As shown in FIG. 3, the III-V compound semiconductor layer 14 may include a first semiconductor layer 26 and a second semiconductor layer 28 that are alternately stacked. The III-V compound semiconductor layer 14 thus has a multi-layered film structure. Preferably the III-V compound semiconductor layer 14 has a superlattice structure wherein the semiconductor layers 26 and semiconductor layers 28 are formed by thin films of thickness of a few nm in each layer. In this case, the equivalent band gap energy (Eg2) of the III-V compound semiconductor layer 14 is substantially the same as the band gap energy corresponding to a material of a composition represented by a weighted average of the composition of the material of the semiconductor layers 26 and the composition of the material of the semiconductor layers 28. Namely, with the semiconductor layer 26, we multiply the composition by the ratio of the total thickness of this layer to the entire thickness of the super lattice semiconductor layer 14, and thus obtain the product. With the semiconductor layer 28, we calculate the same product, summing up these two products, the weighted average composition is obtained. For example, if the semiconductor layers 26 are of composition: $Al_{x1}Ga_{1-x1}As$, of thickness d1 and number of layers N1, and the semiconductor layers 28 are of composition: $Al_{x2}Ga_{1-x2}As$, of thickness d2 and number of layers N2, the equivalent band gap energy of these superlattice layers is equal to the band gap energy of AlGaAs with a weighted average composition calculated as follows:

Al average composition =

$$(x1*d1*N1 + x2*d2*N2)/(d1*N1 + d2*N2)$$

Ga average composition =

$$\{(1-x1)*d1*N1 + (1-x2)*d2*N2\}/(d1*N1 + d2*N2)$$

As average compostion =

$$(1*d1*N1 + 1*d2*N2)/(d1*N1 + d2*N2) = 1$$

The band gap energy ($E_\alpha$) of a semiconductor layer 26 is different from the band gap energy ($E_\beta$) of a semiconductor layer 28. In this case, propagation of crystal defects is easily stopped the large number of interfaces between semiconductor layers 26 and semiconductor layers 28. The extent to which crystal defects d1 present at the surface 12a of the GaAs substrate 12 propagate and reach the active layer 16 can thereby be further suppressed.

The semiconductor layers 26 and semiconductor layers 28 may be of the same type of material. In this case, the composition ratio of the material of the semiconductor layer 26 is different from the composition ratio of the material of the semiconductor layer 28. Examples of such materials include AlGaInP, AlGaAs, and GaInAsP. Also, the semiconductor layers 26 and semiconductor layers 28 may be made of different materials. Examples of such material combinations include AlGaInP/GaInP, AlGaInP/GaInAsP, GaInP/GaInAsP, AlGaInP/GaAs, GaInP/GaAs, AlGaAs/GaAs, and GaInAsP/GaAs. In such superlattice combinations, the equivalent band gap energy can be made larger than in the case of the GaAs substrate by suitable selection of the material composition of the semiconductor layers 26, 28. Consequently, even when such superlattices are employed for the III-V compound semiconductor layer 14, a semiconductor optical device 10 of improved light emission efficiency and reliability like that described above can be obtained.

Second Embodiment

Figure 4:
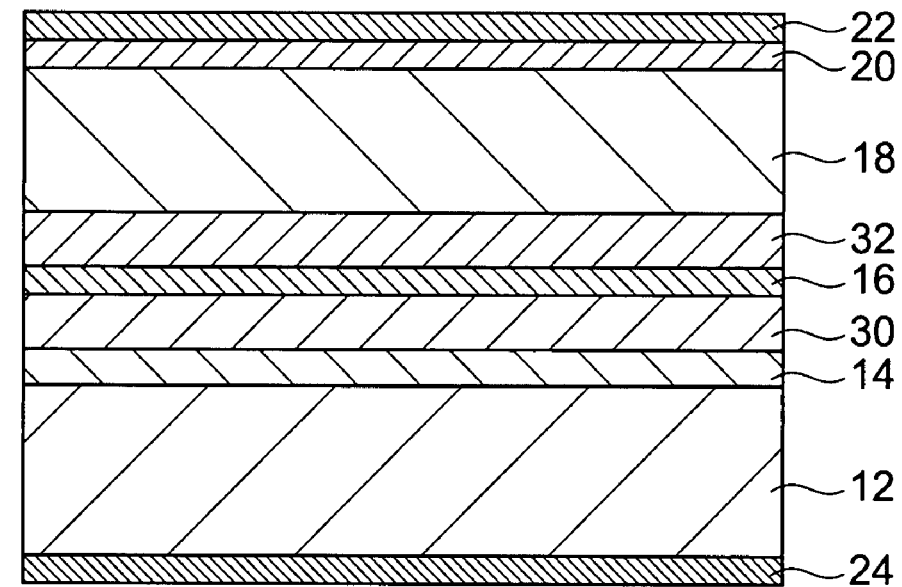
FIG. 4 is a cross-sectional view showing schematically a semiconductor optical device according to a second embodiment.

FIG. 4 is a cross-sectional view showing schematically a semiconductor optical device according to a second embodiment. The semiconductor optical device 10a shown in FIG. 4, in addition to the structure of the semiconductor optical device 10 according to the first embodiment, comprises an optical confinement layer 30 provided between the active layer 16 and the III-V compound semiconductor layer 14, and an optical confinement layer 32 provided between the active layer 16 and the upper cladding layer 18. These optical confinement layers 30, 32 are preferably undoped III-V compound semiconductors. The optical confinement layer 30 may be of first conductivity type. The optical confinement layer 32 may be of second conductivity type.

In the case of the semiconductor optical device 10a, the same beneficial effect is obtained as in the case of the semiconductor optical device 10 according to the first embodiment. Furthermore, more light can be confined in the active layer 16, thanks to the optical confinement layers 30, 32. Consequently, the light emission efficiency can be further improved compared with that of the semiconductor optical device 10 according to the first embodiment.

Preferably the band gap energy of the optical confinement layer 30 is between the band gap energy (Eg1) of the GaAs substrate 12 and the band gap energy (Eg3) of the active layer 16. If this is the case, the optical confinement layer 30 does not constitute a barrier when carriers are injected into the active layer 16 from the GaAs substrate 12. Likewise, preferably the band gap energy of the optical confinement layer 32 is between the band gap energy (Eg4) of the upper cladding layer 18 and the band gap energy (Eg3) of the active layer 16. If this is the case, the optical confinement layer 32 does not constitute a barrier when carriers are injected into the active layer 16 from the upper cladding layer 18.

Also, the refractive index of the optical confinement layer 30 is preferably between the refractive index of the GaAs substrate 12 and the refractive index of the active layer 16, while the refractive index of the optical confinement layer 32 is preferably between the refractive index of the upper cladding layer 18 and the refractive index of the active layer 16. In this case, the GaAs substrate 12 and upper cladding layer 18 act so as to confine light generated in the active layer 16 within the active layer 16 and optical confinement layers 30, 32; as a result, confinement of light into the active layer 16 is enhanced. In particular, when the active layer 16 has a quantum well structure, optical confinement into the active layer is little if only the active layer is incorporated, but it can be greatly increased by introducing the optical confinement layers 30, 32.

As an example of a material that may be used for the optical confinement layers 30, 32, the III-V compound semiconductor material containing N, Ga and As mentioned in the first embodiment can be used for them. In addition, the optical confinement layers 30, 32 may be made of for example GaInAs or GaInAsP. These have a lattice constant that is the same as or close to the lattice constant of GaAs. Consequently, since they can be grown on the GaAs substrate 12 without generation of defects such as misfit dislocations caused by lattice mismatching, optical confinement layers 30, 32 of excellent crystal properties can be epitaxially grown. The band gap energy and the refractive indices of the optical confinement layers 30, 32 can be adjusted to the desired values by adjusting the composition ratios of the materials.

Third Embodiment

Figure 5:
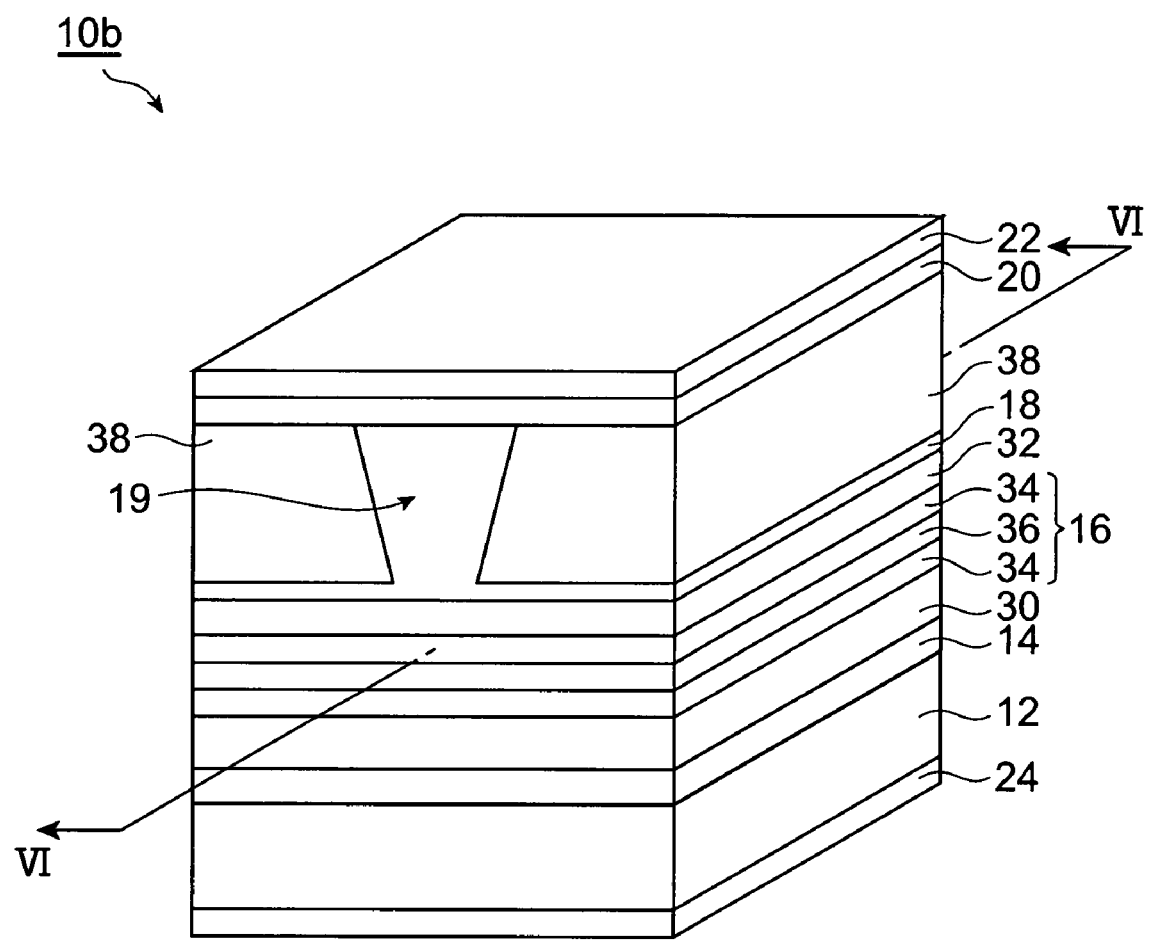
FIG. 5 is a perspective view showing schematically a semiconductor optical device according to a third embodiment.
Figure 6:
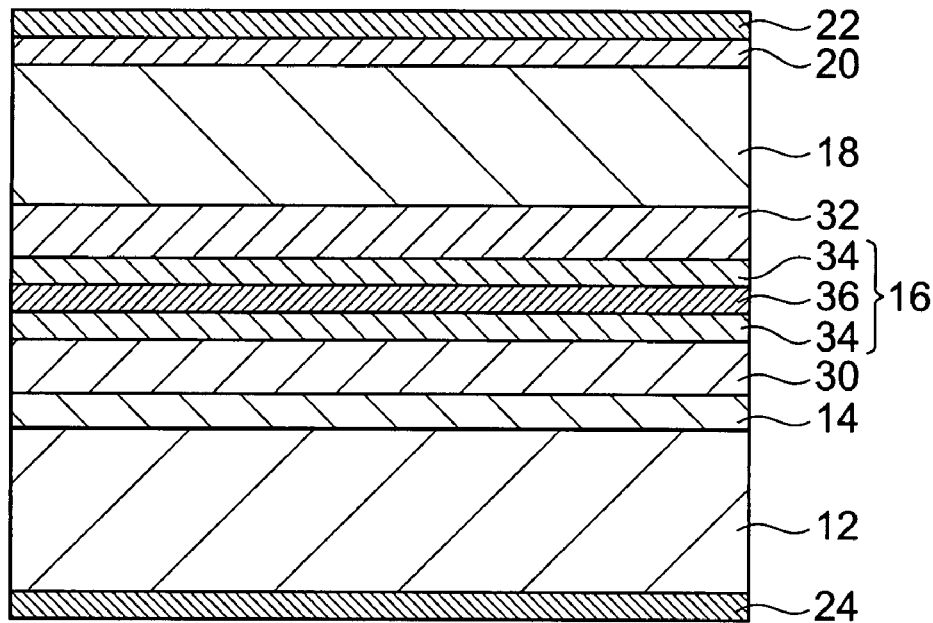
FIG. 6 is a cross-sectional view along the line VI-VI shown in FIG. 5.

FIG. 5 is a perspective view showing schematically a semiconductor optical device according to a third embodiment. FIG. 6 is a cross-sectional view along a line VI-VI shown in FIG. 5. In the semiconductor optical device 10b shown in FIG. 5 and FIG. 6, the upper cladding layer 18 in the structure of the semiconductor optical device 10a according to the second embodiment has a ridge section 19, also the semiconductor optical device 10b further comprises a current blocking region 38 of first conductivity type (in this case assumed to be n type), provided between the upper cladding layer 18 and contact layer 20 such as to bury this ridge section 19. A current confinement structure is formed by this ridge section 19 and the current blocking region 38. Also, the active layer 16 has a quantum well structure comprising well layers 34 and barrier layers 36 alternately stacked.

Preferably the current blocking region 38 is made of a semiconductor material lattice-matched to GaAs. Also, in order to confine the light in the ridge section 19, the refractive index of the current blocking region 38 is preferably smaller than the refractive index of the upper cladding layer 18. If the upper cladding layer 18 is made of GaAs, examples of semiconductor materials for constituting the current blocking region 38, which are of lower refractive index than GaAs and that can achieve lattice matching therewith include AlGaAs, AlGaInP, and GaInP. For example Se or Si are preferably employed as the n-type dopant of the current blocking region 38.

Figure 7A:
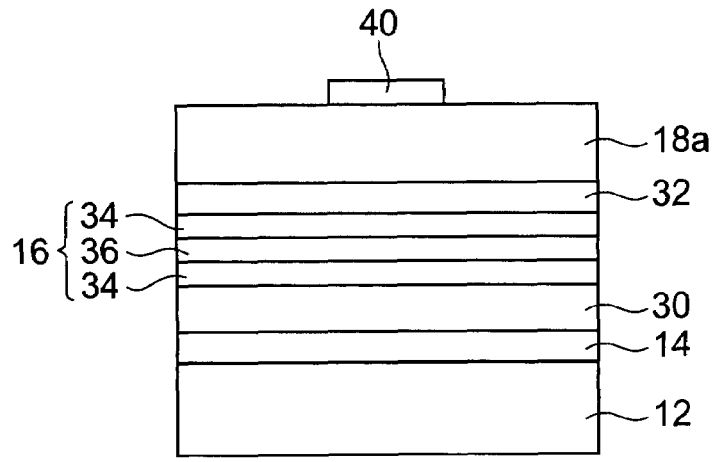
FIGS. 7A to 7C are views showing schematically steps in a method of manufacturing a semiconductor optical device according to the third embodiment.
Figure 7B:
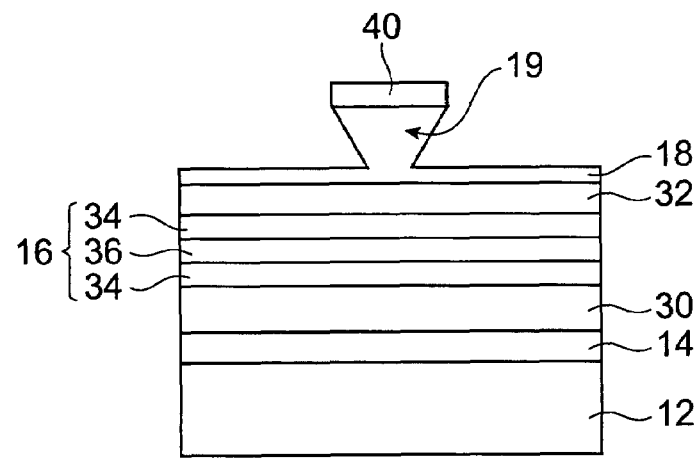
Figure 7C:
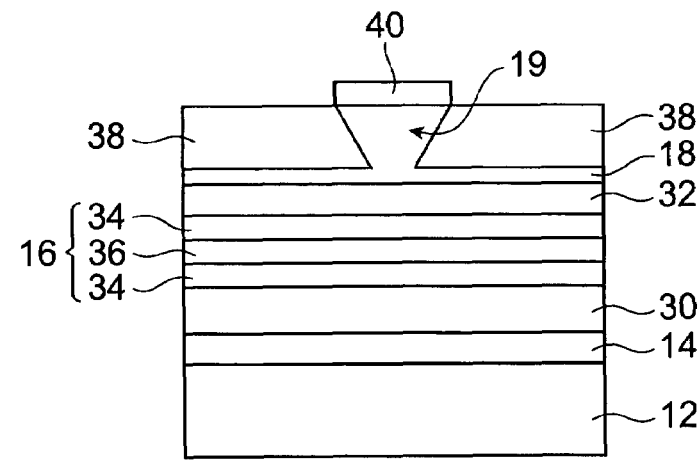

FIGS. 7A to 7C are views showing schematically steps in a method of manufacturing a semiconductor optical device according to a third embodiment. The method of manufacturing a semiconductor optical device 10b is described below.

First of all, as shown in FIG. 7A, a III-V compound semiconductor layer 14, an optical confinement layer 30, a well layer 34, a barrier layer 36, a well layer 34, an optical confinement layer 32 and an upper cladding layer 18a are grown in that order on a GaAs substrate 12 of first conductivity type (in this case assumed to be n type). These layers may be grown using crystal growth method such as for example the MBE method, OMVPE method or LPE method. If for example the OMVPE method is used, metal organic compound such as for example TEG, TMG, TMI or TMA may suitably be used as the group III source material. As the group V source material, hydride gases such as for example $AsH_3$, or $PH_3$ may suitably be employed. As the N source material, for example DMHy may suitably be employed. As the p-type dopant, for example Zn may be employed.

In addition, a dielectric mask 40 that is patterned so as to correspond to the shape of the top face of the ridge section 19 is formed on top of the cladding layer 18a. The dielectric mask 40 is made of for example SiN or $SiO_2$.

Next, an upper cladding 18 having a ridge section 19 is formed by dry etching or wet etching of the upper cladding layer 18a using the dielectric mask 40, as shown in FIG. 7B.

Next, as shown in FIG. 7C, a current blocking region 38 is grown on the upper cladding layer 18 so as to bury the ridge section 19.

Next, after removal of the dielectric mask 40, as shown in FIG. 5 and FIG. 6, a contact layer 20 is grown on the ridge section 19 and current blocking region 38. After this, an electrode 22 is formed on the contact layer 20 and an electrode 24 is formed on the back face of the GaAs substrate 12, using for example an evaporation method or sputtering method. In this way, a semiconductor optical device 10b is manufactured.

It should be noted that, as the material of the current blocking region 38, there may be employed for example benzocyclobutene (BCB), polyimide, or a semi-insulating semiconductor. Also, instead of the current blocking region 38, the side faces of the ridge section 19 may be covered with an insulating film of for example SiN or $SiO_2$. Furthermore, when etching the upper cladding layer 18a, a mesa section may be formed by etching as far as the active layer 16 and a buried hetero structure may then be formed wherein this mesa section is buried by a semiconductor region having a heterojunction.

Although suitable embodiments of the present invention have been described above in detail, the present invention is not restricted to the above embodiments.

For example, the semiconductor optical devices 10, 10a, 10b are not restricted to semiconductor lasers, but could be for example LEDs, semiconductor optical amplifier devices, electro-absorption type optical modulators or semiconductor optical integrated devices obtained by integrating these. In all these cases, the device structure can be simplified and the bad effects that crystal defects present at the surface of the GaAs substrate have on the active layer can be reduced. Also, since carriers and light can be confined in the active layer, the device performance can be improved.

With the present invention, a semiconductor optical device is provided having a simple structure and that is of high light-emitting efficiency.

What is claimed is:

1. A semiconductor optical device comprising:
   a GaAs substrate of a first conductivity type, said GaAs substrate being used as a lower cladding;
   a III-V compound semiconductor layer provided on the GaAs substrate;
   an active layer provided on the III-V compound semiconductor layer; and
   an upper cladding layer of a second conductivity type provided on the active layer, said active layer being sandwiched between said lower cladding and said upper cladding,
   wherein the band gap energy of the III-V compound semiconductor layer is larger than the band gap energy of the GaAs substrate,
   wherein the band gap energy of the active layer is smaller than the band gap energy of the GaAs substrate, and
   wherein the thickness of the III-V compound semiconductor layer is not more than 0.2 µm.

2. The semiconductor optical device according to claim 1, wherein the III-V compound semiconductor layer is made of undoped III-V compound semiconductor.

3. The semiconductor optical device according to claim 1, wherein the III-V compound semiconductor layer includes a first semiconductor layer and a second semiconductor layer alternately stacked, and
   wherein the band gap energy of the first semiconductor layer is different from the band gap energy of the second semiconductor layer.

4. The semiconductor optical device according to claim 1, wherein the thickness of the III-V compound semiconductor layer is greater than 5 nm and less than or equal to 50 nm.

* * * * *